(12) United States Patent
Dayton et al.

(10) Patent No.: US 11,240,433 B2
(45) Date of Patent: Feb. 1, 2022

(54) SYSTEM AND METHOD FOR X-RAY COMPATIBLE 2D STREAK CAMERA FOR A SNAPSHOT MULTIFRAME IMAGER

(71) Applicant: Lawrence Livermore National Security, LLC, Livermore, CA (US)

(72) Inventors: Matthew S. Dayton, Hayward, CA (US); John E. Field, Dorrington, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 16/857,913

(22) Filed: Apr. 24, 2020

(65) Prior Publication Data

US 2020/0404180 A1    Dec. 24, 2020

Related U.S. Application Data

(60) Provisional application No. 62/864,206, filed on Jun. 20, 2019.

(51) Int. Cl.
| | |
|---|---|
| *H04N 5/225* | (2006.01) |
| *H04N 5/232* | (2006.01) |
| *H04N 5/372* | (2011.01) |
| *H04N 5/32* | (2006.01) |

(52) U.S. Cl.
CPC ......... *H04N 5/23277* (2013.01); *H04N 5/372* (2013.01); *H04N 5/32* (2013.01)

(58) Field of Classification Search
CPC ............................. H03M 7/3062; H04N 5/225
USPC ................................................... 348/207.99
See application file for complete search history.

(56) References Cited

U.S. PATENT DOCUMENTS

| | | | | |
|---|---|---|---|---|
| 2013/0043375 A1* | 2/2013 | Baleine | ............ | H01L 31/02327 250/237 R |
| 2018/0224552 A1* | 8/2018 | Wang | ....................... | G01S 17/10 |
| 2018/0367742 A1* | 12/2018 | Ando | ............... | H04N 5/232121 |
| 2020/0288110 A1* | 9/2020 | Wang | ................... | H04N 13/282 |
| 2021/0019923 A1* | 1/2021 | Huang | ................... | G06T 11/003 |

OTHER PUBLICATIONS

Liang Gao, Jinyang Liang, Chiye Li, and Lihong V Wang. Single-shot compressed ultrafast photography at one hundred billion frames per second. Nature, 516(7529):74, 2014.

(Continued)

*Primary Examiner* — Anthony J Daniels
(74) *Attorney, Agent, or Firm* — Harness, Dickey & Pierce, P.L.C.

(57) ABSTRACT

The present disclosure is directed to a snapshot multiframe imager having an aperture element having at least one aperture, an adjacently positioned random mask, an imaging element and a computer. The random mask has a plurality of micron scale apertures and receives light passing through the aperture element, which represents the spatial information from the scene being imaged, and generates a plurality of image frames encoded in a spatial domain. The imaging element may operate in a drift-scan mode receives the encoded image frames and generates a streaked pattern of electrons representing a plurality of images of the scene at a plurality of different times. The computer analyzes the streaked pattern of electrons and mathematically reconstructs the plurality of images.

21 Claims, 4 Drawing Sheets

(56) References Cited

OTHER PUBLICATIONS

Jinyang Liang, Liang Gao, Pengfei Hai, Chiye Li, and Lihong V Wang. Encrypted three-dimensional dynamic imaging using snapshot time-of-flight compressed ultrafast photography. Scientific reports, 5:15504, 2015.
Barmak Heshmat, Guy Satat, Christopher Barsi, and Ramesh Raskar. Single-shot ultrafast imaging using parallax-free alignment with a tilted lenslet array. In CLEO: Science and Innovations, pp. STu3E-7. Optical Society of America, 2014.
Nagel, T. J. Hilsabeck, P. M. Bell D. K. Bradley M. J. Ayers M. A. Barrios B. Felker R. F. Smith G. W. Collins O. S. Jones J. D. Kilkenny T. Chung K. Piston K. S. Raman B. Sammuli J. D. Hares A. K. L. Dymoke-Bradshaw S. R. Dilation x-ray imager a new/faster gated x-ray imager for the NIF, Rev. Sci. Instrum. 83, 10E116, 2012.
LR Benedetti, JP Holder, M Perkins, CG Brown, CS Anderson, FV Allen, RB Petre, D Hargrove, SM Glenn, N Simanovskaia, et al. Advances in x-ray framing cameras at the National Ignition Facility to improve quantitative precision in x-ray imaging, Review of Scientific Instruments, 87(2): 023511, 2016.

* cited by examiner

SYSTEM AND METHOD FOR X-RAY COMPATIBLE 2D STREAK CAMERA FOR A SNAPSHOT MULTIFRAME IMAGER

CROSS-REFERENCE TO RELATED APPLICATIONS

This application claims the benefit and priority of U.S. Provisional Application No. 62/864,206, filed on Jun. 20, 2019. The entire disclosure of the above application is incorporated herein by reference.

STATEMENT OF GOVERNMENT RIGHTS

The United States Government has rights in this invention pursuant to Contract No. DE-AC52-07NA27344 between the U.S. Department of Energy and Lawrence Livermore National Security, LLC, for the operation of Lawrence Livermore National Laboratory.

FIELD

The present disclosure relates generally to systems and method involving compressed ultrafast photography (CUP), and more particularly to a snapshot multiframe imaging system and method which makes use of an encoding structure and technique that encodes images in a pseudo-Fourier domain, which enables the system to be implemented with both X-rays and visible light, and which does not strictly require sparsity assumption about the source images.

BACKGROUND

The statements in this section merely provide background information related to the present disclosure and may not constitute prior art.

Existing systems and methods for carrying out an imaging technique known as Compressed Ultrafast Photography ("CUP") is lossy which lead to poor image reconstructions that precludes it from wide application. A typical CUP system makes use of a streak camera. Streak cameras are routinely used to record events at the sub-nanosecond scale in a single spatial dimension with a slit to record a 1D image. CUP techniques open up the streak camera's slit in the vertical direction to streak a 2D image that has been encoded in the spatial domain. The image acquisition step is also done in the spatial domain, followed by the streak camera's shearing operation in time. The streak camera then captures the two-dimensions and time (x, y, t) with a single CCD image. Mathematically, this process is equivalent to successively applying a spatial encoding operator and a temporal shearing operator to the intensity distribution from the input dynamic scene. The subsequent image reconstruction step minimizes an objective function to reconstruct the original scene. Many algorithms exist to handle this class of unconstrained linear inverse problem.

The CUP systems typically use optical lenses to focus the 2D images onto the photocathode and encodes them in the spatial image plane. The encoding is typically done with a randomly coded mask. One significant drawback is that the blocked out areas, rejected by the randomly encoded mask, are lost forever unless the input images meet a sparsity requirement. The streak camera captures the two-dimensions and time (x, y, t) with a single CCD image. Since the encoding and image streak operator are both linear operators, the process can be inverted mathematically, and the remaining spatial information can be reconstructed into a series of images. Since the problem is mathematically ill constrained due to the integration of images atop of each other, a regularizer function that promote sparsity is used to help invert the process and reconstruct the image instead of the usual Ordinary Least Squares (OLS) approach. This helps fill-in missing information.

However, the above-described CUP-based camera removes half of spatial information, since only the photons that pass through the random mask are available to form the recreated image. For this reason, the traditional CUP technique relies heavily on the reconstruction algorithm for image quality. The algorithm produces gross distortion in the reconstructed images if they do not meet a strict sparsity requirement. Although, the above-described CUP-based camera is theoretically compatible with x-rays, its collection efficiency would be poor, since it would rely on a single pinhole as its imaging optic and hence image reconstruction would be challenging.

SUMMARY

This section provides a general summary of the disclosure, and is not a comprehensive disclosure of its full scope or all of its features.

In one aspect the present disclosure relates to a snapshot, multiframe imaging system. The system may comprise an aperture element having at least one aperture, and a random mask. The random mask may have a plurality of micron scale apertures, and may be spaced apart from the aperture element. The random mask may receive light representing the spatial information from the scene being imaged, where the light passes through the aperture element and impinges the mask, and where the random mask generates a plurality of image frames encoded in a spatial domain. An imaging element may be included which is disposed adjacent the random mask, and which operates in a drift-scan mode. The imaging element may be configured to receive the encoded image frames and to generate therefrom a streaked pattern of electrons representing a plurality of images of the scene at a plurality of different times. A computer may be included for analyzing the streaked pattern of electrons and mathematically reconstructing the plurality of images.

In another aspect the present disclosure relates to a snapshot, multiframe ultrafast photography system. The system may comprise at least one of a random aperture element or a pinhole array forming a plate having a plurality of randomly spaced apertures having dimensions in a range of microns to hundreds of microns in diameter. The system may also include a random mask having a plurality of micron scale apertures, spaced apart from the random aperture element, which receives light representing the spatial information from the scene being imaged. The light passes through the random aperture element and impinges the mask. This causes the random mask to generate a plurality of image frames encoded in a spatial domain. An imaging element may be included which is disposed adjacent the random mask. The imaging element may include a photocathode and may be configured to operate in a drift-scan mode to receive the encoded image frames. The imaging element may generate therefrom a streaked pattern of electrons representing a plurality of images of the scene at a plurality of different times. A computer may be included for analyzing the streaked pattern of electrons and mathematically reconstructing the plurality of images.

In still another aspect the present disclosure relates to a method for performing ultrafast, multiframe photography. The method may comprise using an aperture element having at least one aperture disposed adjacent a scene to be imaged. The method may further include using a random mask spaced having a plurality of micron scale apertures, spaced apart from the aperture element, to receive light representing the spatial information from the scene being imaged, where the light passes through the aperture element and impinges the mask. The method may further include using the ransom mask to generate a plurality of image frames encoded in a spatial domain. The method may further include using an imaging device disposed adjacent the random mask, and operating in a drift-scan mode, to receive the encoded image frames and to generate therefrom a streaked pattern of electrons representing a plurality of images of the scene at a plurality of different times. The method may further include using a computer to analyze the streaked pattern of electrons and to mathematically reconstruct the plurality of images.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

FIG. 2b is a high level diagram illustrating a penumbral optic and how such an optic may be used with the system of FIG. 1 in place of the random aperture element of FIG. 2a;

DETAILED DESCRIPTION

Example embodiments will now be described more fully with reference to the accompanying drawings.

The systems and methods of the present disclosure provide a snapshot multiframe imaging (i.e., photography) system having significant advancements over previously developed CUP systems. The systems and methods of the present disclosure are not limited to use with a specific algorithm, nor do they require a specific type of streak camera. The systems and methods of the present disclosure provide a new way of encoding the image during the image acquisition step using a random aperture in connection with a random pseudo mask, which also enables the system to image X-rays as well as visible light. Still further, the present disclosure presents embodiments that may operate in either of two modes of operation: a compressive imaging mode and un-compressive imaging mode. In the un-compressive mode, the system and method does not make assumptions about the input images that a conventional CUP (i.e., compressed) imager does. Accordingly, the systems and methods of the present disclosure represent an entirely new class of imager that is able to operate in both compressive and un-compressive imaging regimes.

Figure 1:
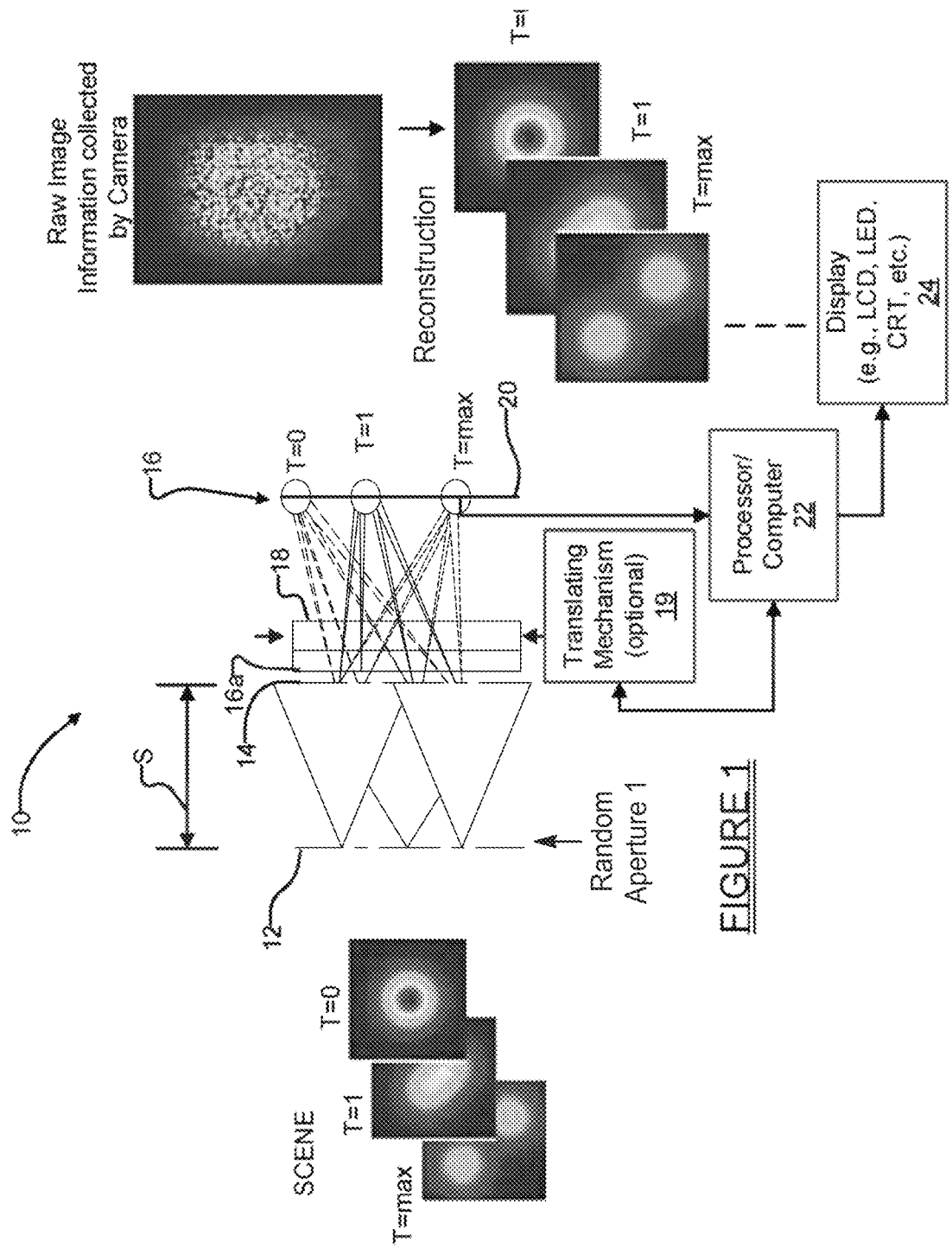
FIG. 1 is a high level block diagram illustration of one embodiment of an x-ray compatible, snapshot multiframe imaging system in accordance with the present disclosure.

With reference to FIG. 1 one embodiment of a snapshot multiframe imaging system 10 in accordance with the present disclosure is shown. The snapshot multiframe imaging system 10 (hereinafter simply "system 10") in this example may include a random aperture element 12, a random mask 14 for creating a pseudo-random encoded image, and an imaging element 16 which may operate in a drift-scan mode. CCD sensors will use a drift-scan mode to read out the last row of the image, then shift the remaining rows down by one to replace it while the image continues to integrate. This shift is repeated until all rows are read out, which produces a streaked image. In one embodiment the imaging element may be, without limitation, a streak camera 16. In another embodiment the imaging element 16 may be, without limitation, a charge coupled device (CCD). Merely for convenience, the following discussion will reference the imaging element 16 as "the streak camera 16".

The streak camera 16 may have a plurality of components including a slit aperture 16a, a photocathode 18 disposed adjacent to the streak camera 16 to receive photons passing through the slit aperture 16a as the slit aperture is opened, and to generate electrons in response to the received photons, and an image recording device 20 such as, without limitation, a CMOS device or CCD. A processor or computer 22 (hereinafter simply "computer" 20) is also provided for receiving an output from the image recording device 20 and providing an output to a display 24. The computer 22 may include the needed processing capability to perform the mathematically intensive operations of reconstructing the images from the data provided by the image recording device 20.

The display 24 may be a LCD, LED, CRT or any other suitable display for displaying the reconstructed images mathematically reconstructed by the computer 22. The photocathode 18 may be optional if a translation mechanism, such as translation mechanism 19, is provided to translate (i.e., "streak") the camera 16 linearly a small distance in a controlled manner, either independently or in response to control signals from the computer 20. Both implementations are contemplated by the present disclosure. In this example, however, the photocathode 18 is used to convert the light received through the slit aperture 16a into electrons, which are streaked downward over time in the illustration of FIG. 1.

Figure 2A:
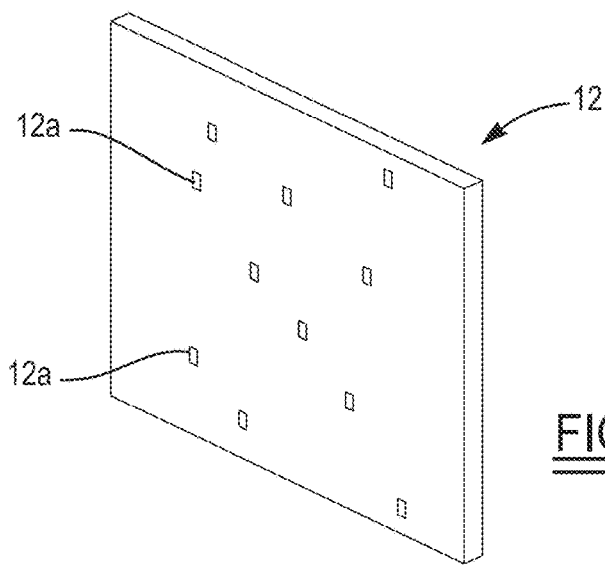
FIG. 2a is a simplified perspective view of one embodiment of the random aperture element shown in FIG. 1.

FIG. 2a illustrates in simplified form the random aperture element 12. The random aperture element 12 may be formed by a plate-like component having an array of randomly located apertures 12a, which in one example may be an array of randomly positioned pin-holes. The apertures 12a may have openings on the micron scale, and in some implementations apertures on a scale of 100's of microns. Apertures of such small dimensions may be formed using a lithographic process or possibly other processes as well. For example, micro-machining, which is presently limited to about 20 µm feature sizes, but it would only be appropriate for an extra large streak camera and photocathode. The spacing between the random aperture element 12 and the random mask 14, represented by arrow "S" in FIG. 1, is preferably fixed, and may be based on the level of magnification that one desires. For example, for a one-to-one magnification, one would preferably set the spacing S to the same distance that separates the random aperture element 12 from the scene being imaged. It will be appreciated that while the distance (i.e., spacing) "S" can be changed, this may necessitate modifications to the specific reconstruction algorithm being used to accommodate the distance. Also, there will be a minimum distance "S" that is dependent on the streak camera's 16 spatial resolution. FIG. 1 shows the three images obtained at T=0, T=1 and T=max falling at spaced apart locations on the image recording device 20, as the slit aperture 16a is opened and the electrons from the photocathode 18 are streaked onto the image recording device 20.

The system 10 sets forth a new way of encoding the image during an image acquisition operation. The objective function takes the general form of Equation 1 below:

$$f(x) = \tfrac{1}{2}\|y - Kx\|^2 + \lambda \Phi(x) \qquad \text{Equation 1}$$

where the first set of terms (i.e., $0.5\|y-Kx\|^2$) describes how well the estimated image fits the data and the other set of terms (i.e., $\lambda/\phi(x)$ describes how well the estimated image makes sense. In the typical sum of squares part of the equation, "y" is the image collected with the streak camera and "x" are the frames we want to reconstruct from the image. The "K" matrix contains the various linear operations, such as the streak operator, the random aperture convolution matrix and the random mask matrix. Seen in Equation 2 below. In the part that describes how well the image makes sense, one finds "Δ", which weights the regularizer function "Φ". There are many regularizer functions that can be chosen, for example and without limitation, total-variation (TV) and L1-norm.

To encode the image, the previously developed CUP technique uses a digital micromirror device, which sits in the image plane to create a pseudo-random pattern and encodes the image. However, significant spatial information is lost for images that do not meet the sparsity requirement. The system 10 relaxes these limitations by encoding the images differently. Instead, a pseudo-Fourier plane is created instead with the random aperture element 12. The goal is to spread the spatial information representing the scene over a large area so that the random mask 14 placed in front of the streak camera does not prevent the information from being recovered. This technique has a higher sample ratio of the input images compared with the conventional CUP that allows it to operate in a mode that does not assume sparsity of the input images and does not rely on the regularizer to fill in missing information so the reconstruction quality is high and the optimization of the regularizer becomes less important.

The collection efficiency of the system 10, when used with the random aperture element 12, is much better than when a typical pinhole that is used for X-ray imaging. This is because the number of collected photons significantly increases, which helps to reduce the impact of any photocathode generated noise, which is especially helpful in low flux environments. This is particularly important at the picosecond timescale, which significantly limits the number of photons that would ordinarily be collected with a conventional CUP system. Also, at the picosecond timescale, the signal-to-noise ratio can deteriorate, which can impact the reconstruction quality. With the system 10, the frame rate is determined by the sweep streak speed of the streak camera 16, where a faster sweep speed results in higher frame rates.

Figure 2B:
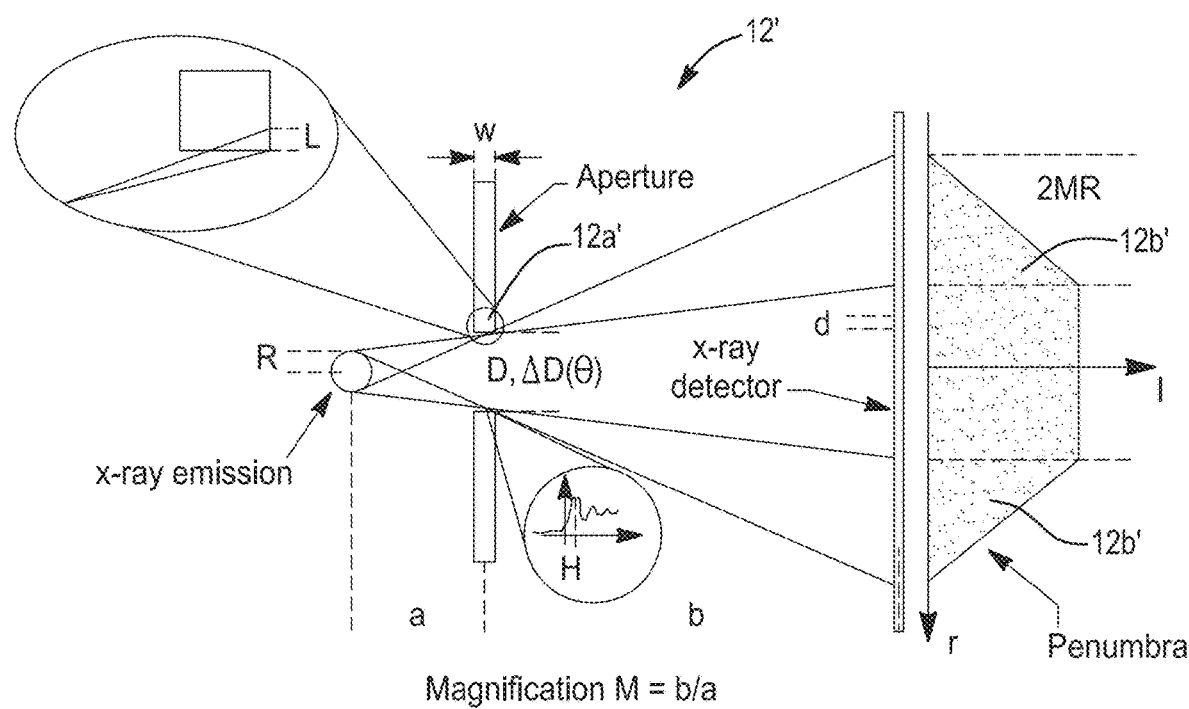

Another option which may be used to replace the random aperture element 12 is a penumbra optic 12', as shown in FIG. 2b. Rather than a plurality of apertures 12a on the micron scale, a single larger aperture 12a', for example on a scale of hundreds of microns, may be used. The single larger aperture 12a', in one implementation, is preferably a circular aperture. The single larger aperture 12a' allows one to perform imaging with sub 5 µm resolution at the photocathode, while simultaneously increasing collection efficiency. This is achieved by increasing the size of the larger aperture 12a' beyond the traditional pinhole size used in previously developed streak camera systems, thus encoding the spatial distribution of photons within the penumbra of the resulting penumbral image, which is represented by the upper and lower triangular sections 12b' shown in FIG. 2b. The encoded penumbral image can then be decoded using various techniques to yield the original source emission distribution. Using the inverse Radon transform, as for example implemented in standard computed tomography algorithms, the solution can be found to be unique, no assumptions have to be made about the source distribution (other than the source extent to be smaller than the aperture 12a' size) and the reconstruction is numerically well behaved as has been shown previously. Additional details concerning details of a penumbral optic are provided in "Appendix A" attached hereto, entitled "*X-Ray Penumbral Imaging Diagnostic Developments at the National Ignition Facility*", R. Bachman et al., SPIE Optics+Photonics, Sep. 27, 2017.

The linear encoding performed by the system 10 can be seen pictorially in FIG. 1. Mathematically, the encoding looks like the convolution of the random coded aperture 12 multiplied by the random mask 14, seen in Equation 2. Equation 2 attempts to describe the system as succinctly as possible. In this formulation, the input scene, x, is projected onto the photocathode of the streak camera through a random aperture and mask. This is described by an image transfer matrix T, which contains the random mask's projection matrix, the random aperture's convolution matrix, and a transformation matrix that enables 2-d convolutions in 1-d. The system noise is assumed to be a random Gaussian noise variable called "e". Each image that is formed at the photocathode is subsequently streaked downwards by a single row by the S matrix. The streak matrix's exponent describes the number of rows the image at the photocathode will land on the CCD imager (e.g., imaging device 20). As the images accumulate at the CCD imager, each shifted down by a single row, the total number of frames is limited by the matrix inversion noise and the difference between the total height of the streak camera 16 and height of the slit aperture 16a, where the total height of the camera 16 should be greater than the height of the image projected onto the photocathode 18.

$$y = Kx + e \qquad \text{Equation 2}$$

$$= (S^0 \; S^1 \; \ldots \; S^f) \begin{pmatrix} T & 0 & \ldots & 0 \\ 0 & T & \ldots & 0 \\ \vdots & \vdots & \ddots & 0 \\ 0 & 0 & 0 & T \end{pmatrix} \begin{pmatrix} x_0 \\ x_1 \\ \vdots \\ x_f \end{pmatrix} + \begin{pmatrix} e_0 \\ e_1 \\ \vdots \\ e_f \end{pmatrix}$$

Figures 3, 4, 5, 6, 7:
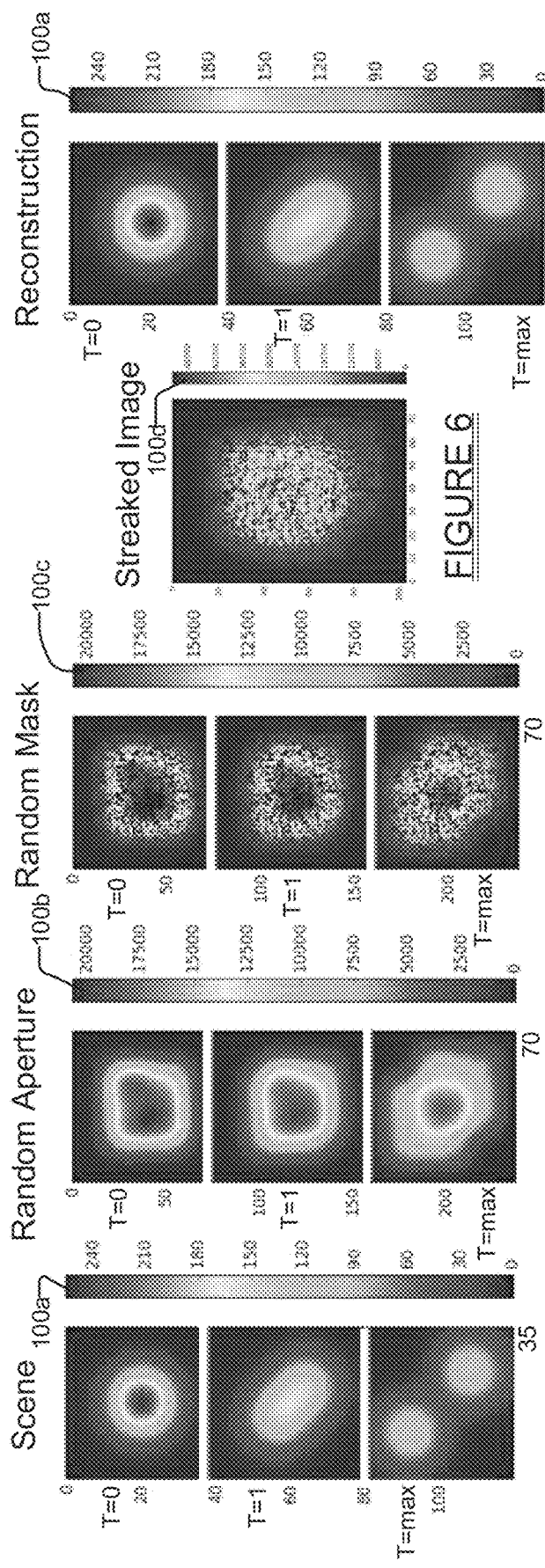
FIG. 3 shows simulations of three scenes to be imaged, with color coding indicating the number of photons present within various subregions of the three scenes.
FIG. 4 shows the same three scenes as imaged by the random aperture of the system of FIG. 1.
FIG. 5 shows the same three scenes as imaged by the random mask of the system of FIG. 1.
FIG. 6 shows the image collected by the image recording device of FIG. 1, wherein all three scenes are overlaid on top of one another, and slightly shifted vertically.
FIG. 7 shows the three scenes (i.e., three image frames representing the three scenes) after being mathematically reconstructed using the computer of FIG. 1.

FIGS. 3-7 illustrate images obtained at different stages of the system 10. FIG. 3 illustrates the scene. Bar graph 100a represents the number of photons in each subregion of the scene at T=0, T=1 and T=max. The images show in FIG. 4, obtained at T=0, T=1 and T=max, represent the scene as imaged at the random aperture 12, and bar graph 100*b* represents the number of photons in the various subregions of each image. The images of FIG. 5 represent the scene as imaged by the random mask 14, while bar graph 100*c* represents the number of photons in the various subregions of the image. The dark specs visible in each of the images of FIG. 5 represent areas where photons were blocked out by the random mask 14. It will also be noted that the pattern of dark specs is constant in each of the frames T=0, T=1 and T=max, since the locations of those areas on the random mask 14 do not change as the camera 16 is streaked. The terms "ra=0.33" and "rm=0.66" mean the transmission of random aperture ("ra"), and the transmission of random mask ("rm"), respectively. The "0.33" and "0.66" values in this example describe the percentages of light are allowed through ra and rm, respectively. The numbers immediately below each illustration of FIGS. 3-5 (i.e., "35", "70" and "70" represent labels for the pixel number. Also, bar graphs 100*b* and 100*c* can be seen to represent a significantly larger number of photons, as compared to the bar graph 100*a*, which is attributable to use of the random aperture 12 and its significantly increased collection efficiency compared to simply use of a pin-hole aperture.

FIG. 6 represents the streaked image "seen" by the image recording device 20, in which essentially the information from each of the images of FIG. 5 are layered one on top of the next, with the image obtained at T=1 shifted slightly in the vertical direction from the image obtained at T=0, and the image obtained at T=max shifted slightly in the vertical direction from the image obtained at T=1. Bar graph 100*d* has significantly higher photon numbers for each subregion of the streaked image, which is indicative of the fact that the streaked image shown in FIG. 6 represents three distinct images.

FIG. 7 shows the reconstructed image frames obtained at T=0, T=1 and T=max. It can be seen that the image frames of FIG. 7 are virtually identical to those of FIG. 3.

Figure 8:
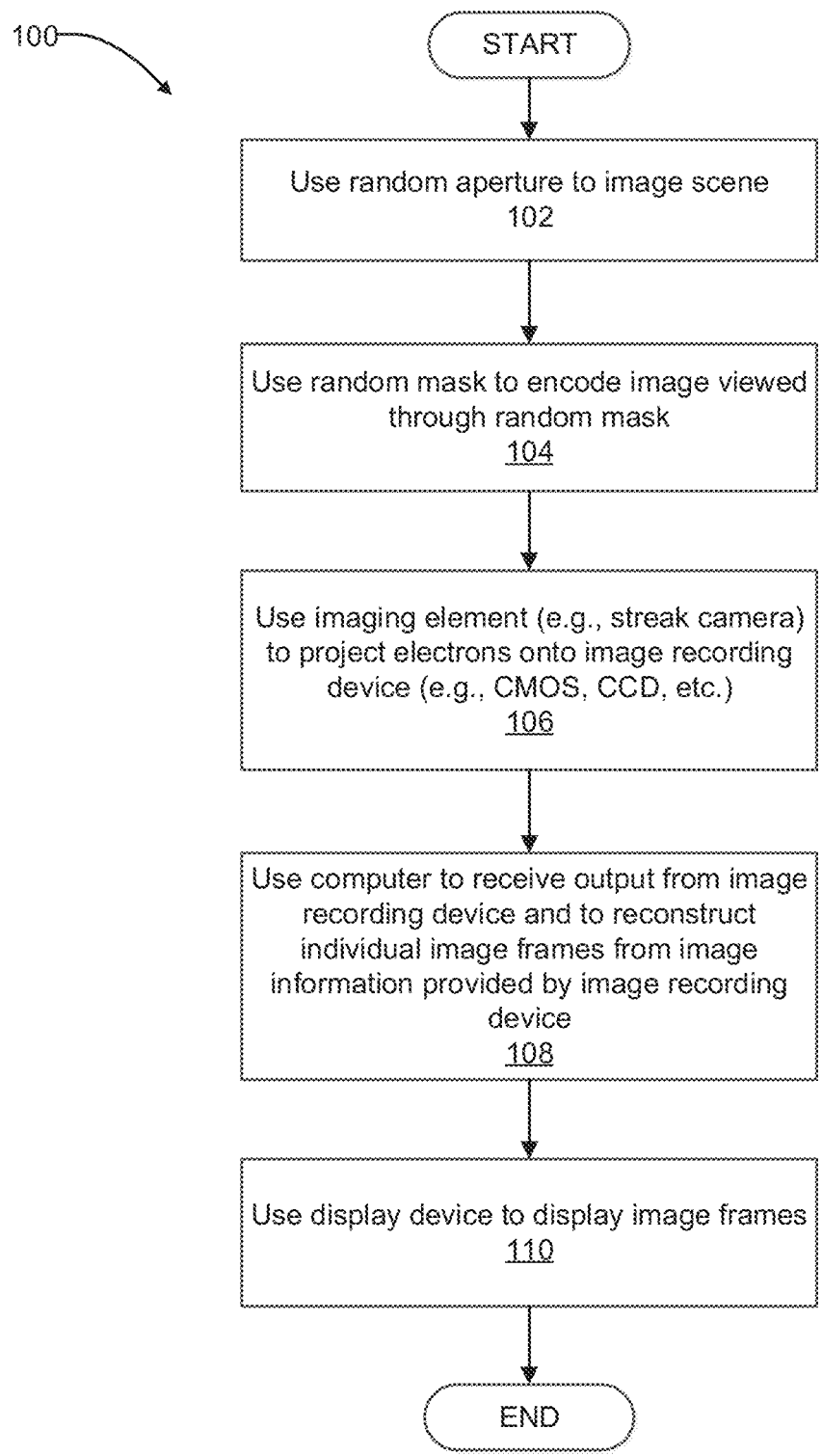
FIG. 8 is a flowchart of operations that may be performed by the system of FIG. 1 in collecting image frames of a scene and reconstructing the image information to produce the image frames shown in FIG. 7.

FIG. 8 shows a flowchart 100 illustrating operations that may be performed by the system 10 of FIG. 1. At operation 102 the random aperture 12 is used to image a scene. At operation 104 the random mask 14 is used to encode the information representing the scene as it is viewed through the random aperture 12. At operation 106 the streak camera 16 is used to obtain and record the image information that makes up the frames of the scene, over a plurality of distinct time periods. At operation 108 the computer 22 uses the information obtained by the image recording device 20 to mathematically reconstruct the individual frames of the scene. At operation 110, the display 24 uses the image information generated by the computer 22 to display the frames of the reconstructed scene.

The system 10 provides much better collection efficiency than that provided by a conventional CUP system making use of a pinhole aperture. In addition, zero-mean noise tolerances are better since the image is spread over the active area of the camera 16. The number of frames is limited only by sweep speed and size of the camera (e.g., CMOS or CCD device). In practice, obtaining frame counts as high as, or even higher than, 350 frames with 10 ps temporal resolution are achievable using the system 10 in a compressive sensing mode. Temporal space charge limitation in a streak camera is less restrictive than Single Line Of Sight (SLOS) instruments since the acceleration potential is higher and remains constant over all frames. Still further, the system 10 is relatively economical to construct since there are no solenoids, no pulser electronics, and no pulse shaping.

The system 10 and methodology described herein is expected to find utility in a wide variety of settings and applications involving, but not limited to, time resolved diffraction experiments, material compression studies to examine spallation, crack formation, micro-jetting and other ultra-fast processes, hyperspectral imaging, and inertial confinement experiments for imaging implosion dynamics.

The system 10 and methodology of the present disclosure may also be implemented as a more economical version of existing x-ray diagnostics currently used in research settings and in industry. The system 10 and methodology is further expected to find utility in x-ray free electron lasers ("XFEL") beam diagnostic applications and near field laser beam diagnostic applications.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A snapshot, multiframe imaging system for imaging a scene, the system comprising:
   a random aperture element having at least one aperture receiving light representing spatial information from the scene being imaged;
   a random mask having a plurality of micron-scale apertures;
   wherein the random mask is spaced apart from the random aperture element;
   wherein the light passes through the random aperture element and impinges the random mask;
   wherein the random mask generates a plurality of encoded image frames of the scene, the plurality of encoded image frames being encoded in a spatial domain;
   an imaging element disposed adjacent the random mask, operating in a drift-scan mode, configured to receive the plurality of encoded image frames and generating from the plurality of encoded image frames a streaked pattern of electrons representing a plurality of images of the scene at a plurality of different times; and
   a computer configured to analyze the streaked pattern of electrons and mathematically reconstruct the plurality of images.

2. The system of claim 1, wherein the imaging element comprises a streak camera.

3. The system of claim 1, wherein the imaging element comprises a charge coupled device (CCD).

4. The system of claim 1, wherein the random aperture element comprises a plurality of random apertures formed therein.

5. The system of claim 4, wherein the plurality of random apertures comprise random apertures on a micron-scale size.

6. The system of claim 4, wherein the plurality of random apertures comprise apertures on a scale of 100s of microns.

7. The system of claim 1, wherein the aperture element comprises a penumbra optic, and wherein the at least one aperture comprises a single aperture.

8. The system of claim 7, wherein the single aperture of the penumbra optic has a dimension on a scale of 100s of microns.

9. The system of claim 1, wherein the imaging element includes a streak camera, a photocathode and an image recording device, the imaging element configured to receive the plurality of encoded image frames and to use the photocathode to generate the streaked pattern of electrons representing the plurality of images, from photons received by the streak camera.

10. The system of claim 1, wherein the imaging element comprises a streak camera having a slit aperture.

11. The system of claim 1, further comprising a translation mechanism for translating the imaging element while photons are passing through the plurality of micron-scale apertures in the random mask.

12. The system of claim 4, wherein the random aperture element creates a pseudo-Fourier plane by spreading out the spatial information from the scene being imaged over an increased area to increase the spatial information captured by the imaging element.

13. The system of claim 4, wherein the plurality of encoded image frames are encoded using an objective function, and where the objective function is set forth below as:

$$f(x) = \tfrac{1}{2}\|y - Kx\|^2 + \lambda \Phi(x),$$

where $\tfrac{1}{2}\|y-Kx\|^2$ describes how well a reconstructed image fits data of the plurality of encoded image frames;

$\lambda/\Phi(x)$ describes a cost function for a reconstructed image that penalizes unlikely solutions, "y" is an image collected with the imaging element, "x" represents image frames to reconstruct from the image, and "K" is a matrix comprising a streak operator, a random aperture convolution matrix, and a random mask matrix.

14. The system of claim 1, further comprising a display for displaying the mathematically reconstructed images.

15. A snapshot, multiframe photography system for imaging a scene, the system comprising:
   a random aperture element forming a plate, the plate having a plurality of randomly spaced apertures having dimensions in a range of microns to hundreds of microns in diameter;
   wherein the random aperture element receives light representing spatial information from the scene being imaged;
   a random mask having a plurality of micron-scale apertures,
   wherein the random mask is spaced apart from the random aperture element,
   wherein the light passes through the random aperture element and impinges the random mask, and
   wherein the random mask generates a plurality of encoded image frames, the plurality of encoded image frames encoded in a spatial domain;
   an imaging element disposed adjacent the random mask, including a photocathode, configured to operate in a drift-scan mode to receive the plurality of encoded image frames, and generating from the plurality of encoded image frames a streaked pattern of electrons representing a plurality of images of the scene at a plurality of different times; and a computer configured to analyze the streaked pattern of electrons and mathematically reconstruct the plurality of images.

16. The system of claim 15, wherein the imaging element comprises at least one of a streak camera or a charge coupled device.

17. The system of claim 16, wherein:
the imaging element further comprises a streak camera, which includes an image recording device; and
the streak camera further includes a slit aperture.

18. The system of claim 15, wherein the random aperture element creates a pseudo-Fourier plane by spreading out the spatial information from the scene being imaged over an increased area to increase the spatial information captured by the imaging element.

19. The system of claim 15, wherein the plurality of encoded image frames are encoded using an objective function, and where the objective function is set forth below as:

$$f(x) = \frac{1}{2}\|y - Kx\|^2 + \lambda \Phi(x),$$

where $\frac{1}{2}\|y - Kx\|^2$ describes how well a reconstructed image fits data of the plurality of encoded image frames;
$\lambda \Phi(x)$ describes a cost function for a reconstructed image that penalizes unlikely solutions,
"y" is an image collected with the imaging element,
"x" represents image frames to reconstruct from the image, and
"K" is a matrix comprising a streak operator, a random aperture convolution matrix, and a random mask matrix.

20. A method for performing multiframe photography to image a scene, the method comprising:
using a random aperture element having at least one aperture on a scale of microns to hundreds of microns in diameter, disposed adjacent a scene to be imaged;
using a random mask having a plurality of micron-scale apertures, spaced apart from the random aperture element, to receive light representing spatial information from the scene being imaged, wherein the light passes through the random aperture element and impinges the random mask;
using the random mask to generate a plurality of encoded image frames, the plurality of encoded image frames being encoded in a spatial domain;
using an imaging element disposed adjacent the random mask, and operating in a drift-scan mode, to receive the plurality of encoded image frames and to generate from the plurality of encoded image frames a streaked pattern of electrons representing a plurality of images of the scene at a plurality of different times; and
using a computer to analyze the streaked pattern of electrons and to mathematically reconstruct the plurality of images.

21. The method of claim 20, wherein using a random aperture element comprises at least one of:
using a random aperture element having a plurality of apertures having dimensions on at least one of a micron-range or a range of hundreds of microns; or
using a penumbra optic having a single aperture.

* * * * *